US009516705B2

(12) United States Patent
Yamamoto

(10) Patent No.: US 9,516,705 B2
(45) Date of Patent: Dec. 6, 2016

(54) ILLUMINATION DEVICE

(75) Inventor: Toshitsugu Yamamoto, Tokyo (JP)

(73) Assignee: KONICA MINOLTA HOLDINGS, INC., Tokyo (JP)

( * ) Notice: Subject to any disclaimer, the term of this patent is extended or adjusted under 35 U.S.C. 154(b) by 69 days.

(21) Appl. No.: 13/697,687

(22) PCT Filed: Jun. 2, 2011

(86) PCT No.: PCT/JP2011/062715
§ 371 (c)(1), (2), (4) Date: Nov. 13, 2012

(87) PCT Pub. No.: WO2011/152496
PCT Pub. Date: Dec. 8, 2011

(65) Prior Publication Data

US 2013/0058086 A1 Mar. 7, 2013

(30) Foreign Application Priority Data

Jun. 4, 2010 (JP) ................................ 2010-128919

(51) Int. Cl.
*H05B 33/08* (2006.01)

(52) U.S. Cl.
CPC ....... *H05B 33/08* (2013.01); *H01L 2251/5361* (2013.01)

(58) Field of Classification Search
CPC ............ H01L 27/3202; H01L 27/3204; H01L 27/3281; H01L 27/3288; H01L 27/329; H01L 27/3293; H01L 51/5203; H01L 51/5206; H01L 51/5212; H01L 2251/5361; H01L 27/3211; H01L 2251/5369; H01L 27/3244; H01L 51/5044; H01L 51/5271; H01L 51/5278; H01L 51/5281; H01L 21/0271; H01L 2251/5315;H01L 27/3209; H01L 29/4908; H01L 51/5221; H05B 33/00; H05B 33/08; H05B 33/0896; H05B 33/22; H05B 33/28; F21Y 2105/008; F21V 21/005; G09G 2300/0426; G09G 3/3208; G09G 2320/0233; G09G 3/3258
(Continued)

(56) References Cited

U.S. PATENT DOCUMENTS 6,157,127 A * 12/2000 Hosokawa et al. ........... 313/506
6,320,312 B1 * 11/2001 Kim et al. .................... 313/506
(Continued)

FOREIGN PATENT DOCUMENTS

JP 2004-212557 A 7/2004
JP 2005-158368 A 6/2005
(Continued)

OTHER PUBLICATIONS

International Search Report in International Application No. PCT/JP2011/062715, mailed Sep. 6, 2011, 2 pages.

*Primary Examiner* — Hargobind S Sawhney
(74) *Attorney, Agent, or Firm* — Brinks Gilson & Lione

(57) ABSTRACT

An object is to provide an illumination device in which uneven light emission that a user may perceive is suppressed. To achieve the object, an illumination device is adopted that includes a power feeding portion and a surface light emitter including a light-emitting surface configured to emit light in accordance with a voltage applied by the power feeding portion and to cause light emission in the shape of a surface. The surface light emitter generates a spatially periodic luminance variation having a substantially constant amplitude.

6 Claims, 10 Drawing Sheets

(58) Field of Classification Search
USPC ... 362/84; 313/503–506; 257/40, 89, 98, 99, 257/100, 642, 759
See application file for complete search history.

(56) References Cited

U.S. PATENT DOCUMENTS

| | | | | |
|---|---|---|---|---|
| 6,476,550 | B1 * | 11/2002 | Oda et al. | 313/504 |
| 6,630,684 | B2 * | 10/2003 | Lee et al. | 257/40 |
| 6,738,577 | B1 * | 5/2004 | Maeda et al. | 396/287 |
| 6,831,407 | B2 * | 12/2004 | Cok | H01L 51/5268 313/504 |
| 7,034,470 | B2 * | 4/2006 | Cok | H01L 27/3204 315/185 R |
| 7,435,151 | B2 * | 10/2008 | Takamura et al. | 445/24 |
| 7,589,463 | B2 * | 9/2009 | Murano et al. | 313/506 |
| 7,759,861 | B2 * | 7/2010 | Fujimoto | H01L 27/3211 313/504 |
| 7,786,665 | B2 * | 8/2010 | Nakanishi et al. | 313/504 |
| 7,902,751 | B2 * | 3/2011 | Hayashi | 313/506 |
| 7,936,124 | B2 * | 5/2011 | Tsou | H01L 51/5203 313/500 |
| 7,999,463 | B2 * | 8/2011 | Nomura | 313/506 |
| 8,026,666 | B2 * | 9/2011 | Miura | 313/506 |
| 8,179,034 | B2 * | 5/2012 | Potts et al. | 313/504 |
| 8,593,055 | B2 * | 11/2013 | Tchakarov et al. | 313/503 |
| 2004/0021425 | A1 * | 2/2004 | Foust | G09F 9/33 315/169.3 |
| 2004/0189883 | A1 | 9/2004 | Koyama | |
| 2004/0263060 | A1 * | 12/2004 | Gilmour | G02F 1/133603 313/501 |
| 2006/0192483 | A1 | 8/2006 | Nakanishi et al. | |
| 2007/0145528 | A1 * | 6/2007 | Fischer | G06K 19/0701 257/532 |
| 2008/0084402 | A1 | 4/2008 | Tateuchi et al. | |
| 2008/0149931 | A1 | 6/2008 | Koyama | |
| 2011/0025200 | A1 | 2/2011 | Rokuhara | |

FOREIGN PATENT DOCUMENTS

| | | | |
|---|---|---|---|
| JP | 2006-114379 | A | 4/2006 |
| JP | 2006-190573 | A | 7/2006 |
| JP | 2008-084560 | A | 4/2008 |
| JP | 2008-116921 | A | 5/2008 |
| JP | 2008-170824 | A | 7/2008 |
| JP | 2009-158478 | A | 7/2009 |
| JP | 2009-245777 | A | 10/2009 |

* cited by examiner

ILLUMINATION DEVICE

This application is the National Stage Application of International Patent Application No. PCT/JP2011/062715, filed Jun. 2, 2011.

TECHNICAL FIELD

The present invention relates to an illumination device that performs surface light emission.

BACKGROUND ART

In recent years, as a device (also called a surface light emission device) for performing surface light emission which causes reduced power consumption, a light-emitting device (also called an organic EL device) that utilizes an organic EL (organic electroluminescence) is attracting attention, and its application to an illumination device, or the like, is in progress.

The organic EL device includes a structure in which an organic light emission layer is interposed between two electrodes (an anode electrode and a cathode electrode). As the area of the organic EL device increases, the likelihood of causing non-uniformity in the thickness of the organic light emission layer during a manufacturing process, or the like, increases. As a result, when the organic EL device emits light, non-uniform luminance, or the like, is exhibited, which may undesirably make a user perceive unevenness in the light emission (also referred to as uneven light emission). Such uneven light emission may also occur due to degradation of the organic light emission layer, or the like, that is caused in accordance with conditions under which the organic EL device is used.

Here, the organic EL device fulfills functions required as an illumination device, as long as a variation in the luminance during light emission falls within a predetermined range. However, if the user perceives a certain level of uneven light emission due to the variation in the luminance, the quality level of the organic EL device as an illumination device is impaired.

Therefore, for preventing occurrence of the uneven light emission, techniques for forming an organic light emission layer with a uniform film thickness have been proposed (for example, Japanese Patent Application Laid-Open No. 2009-245777)

SUMMARY OF THE INVENTION

Problems to be Solved by the Invention

However, even the technique of the Patent Document 1 cannot completely suppress a variation in the film thickness of the organic light emission layer, under such circumstances that increase in the area of the organic EL device is demanded. As a result, the user may perceive uneven light emission. This problem is not only for the organic EL device, but is common to an illumination device that performs surface light emission as a general.

The present invention is made in view of the problem described above, and an object of the present invention is to provide an illumination device in which uneven light emission that a user may perceive is suppressed.

Means for Solving the Problems

To solve the above-described problem, an illumination device according to a first aspect includes: a power feeding portion; and a surface light emitter including a light-emitting surface configured to emit light in accordance with a voltage applied by the power feeding portion and to cause light emission in the shape of a surface, wherein the surface light emitter emits light which generates a spatially periodic luminance variation having a substantially constant amplitude.

An illumination device according to a second aspect is the illumination device according to the first aspect, wherein in the luminance variation, increase and decrease in luminance are repeated five times or more and twenty times or less per viewing angle of 1°.

An illumination device according to a third aspect is the illumination device according to the first aspect, wherein the luminance variation is generated by superimposition of a spatially periodic luminance variation having a substantially constant amplitude and occurring in a first direction and a spatially periodic luminance variation having a substantially constant amplitude and occurring in a second direction different from the first direction.

An illumination device according to a fourth aspect is the illumination device according to the first aspects, wherein the luminance variation generated by the surface light emitter is generated by superimposition of a spatially periodic luminance variation having a substantially constant amplitude and a first spatial frequency and a spatially periodic luminance variation having a substantially constant amplitude and a second spatial frequency different from the first spatial frequency.

An illumination device according to a fifth aspect is the illumination device according to the fourth aspect, wherein the luminance variation generated by the surface light emitter includes a spatially periodic luminance variation in accordance with at least one of a triangular wave and a square wave having a substantially constant amplitude.

An illumination device according to a sixth aspect is the illumination device according to the first aspect, wherein: the surface light emitter includes a first electrode layer, a second electrode layer, and a light emission layer interposed between the first electrode layer and the second electrode layer; and the thickness of the light emission layer has a spatially periodic variation having a substantially constant amplitude.

An illumination device according to a seventh aspect is the illumination device according to the first aspect, wherein: the surface light emitter is structured such that a plurality of light emission units are arranged in parallel at least in one direction, each of the plurality of light emission units including a first electrode layer, a second electrode layer, and a light emission layer interposed between the first electrode layer and the second electrode layer; in each pair of light emission units neighboring each other in the one direction among the plurality of light emission units, a first one end portion of the first electrode layer included in one light emission unit is electrically connected to a second one end portion of the second electrode layer included in the other light emission unit; in accordance with voltage application to the surface light emitter by the power feeding portion, a voltage is applied between the first one end portion of the first electrode layer and the second one end portion of the second electrode layer in each of the light emission units; and in each of the light emission units, the electrical resistance of the first electrode layer in the one direction is higher than the electrical resistance of the second electrode layer in the one direction.

An illumination device according to an eighth aspect is the illumination device according to the first aspect, wherein: the surface light emitter includes a first electrode layer, a second electrode layer, and a light emission layer interposed between the first electrode layer and the second electrode layer; the power feeding portion includes a plurality of wirings that are provided in a spatially periodic manner and that are electrically connected to the first electrode layer, and the power feeding portion applies a voltage between the first electrode layer and the second electrode layer through the plurality of wirings; and the electrical resistance of the first electrode layer in a direction parallel to a main surface thereof is higher than the electrical resistance of the second electrode layer in a direction parallel to a main surface thereof.

An illumination device according to a ninth aspect is the illumination device according to the first aspect, wherein: the surface light emitter includes a transparent base plate, a first electrode layer, a light emission layer, and a second electrode layer, and the first electrode layer, the light emission layer, and the second electrode layer are sequentially laminated on the transparent base plate; and a spatially periodic pattern is provided to the transparent base plate.

An illumination device according to a tenth aspect is the illumination device according to the first aspect, wherein: the surface light emitter includes a transparent base plate, a first electrode layer, a light emission layer, and a second electrode layer, and the first electrode layer, the light emission layer, and the second electrode layer are sequentially laminated on the transparent base plate; and spatially periodic concavities and convexities are provided to the transparent base plate.

Effects of the Invention

In the illumination device according to any of the first to tenth aspects, the presence of the spatially periodic luminance variation having a substantially constant amplitude can suppress uneven light emission that a user may perceive.

In the illumination device according to the second aspect, the uneven light emission that the user may perceive can be efficiently suppressed.

In the illumination device according to any of the third to fifth aspects, the uneven light emission that the user may perceive can be further suppressed.

In the illumination device according to any of the sixth to tenth aspects, the uneven light emission that the user may perceive can be suppressed with a relatively simple configuration.

EMBODIMENT FOR CARRYING OUT THE INVENTION

Figure 1:
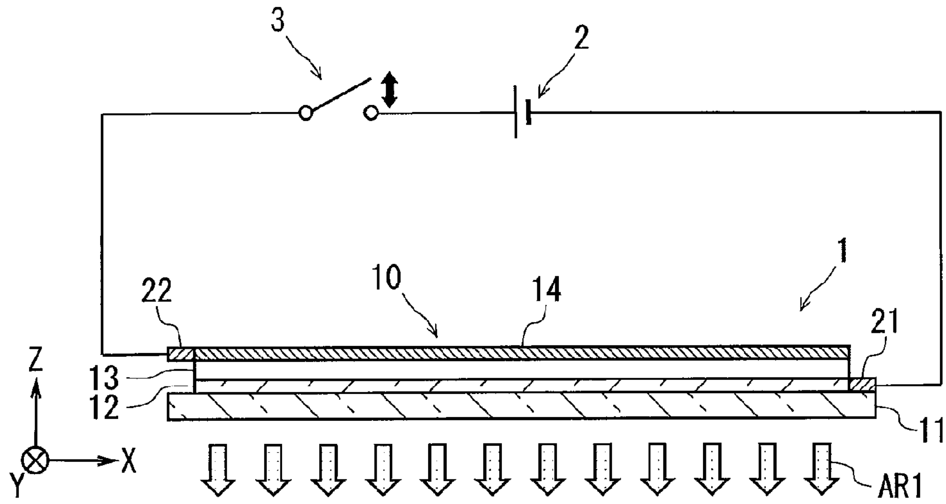
FIG. 1 is a diagram schematically showing an outline configuration of an illumination device according to an embodiment.

Hereinafter, an embodiment of the present invention will be described with reference to the drawings. In the drawings, parts having identical or similar configurations and functions are denoted by the same reference numeral, and redundant descriptions are omitted below. It is to be noted that the drawings are merely schematic, and the sizes, shapes, positional relationships, and the like, of structures are not precisely illustrated in the drawings.

<(1) Outline Configuration of Illumination Device>

Figure 2:
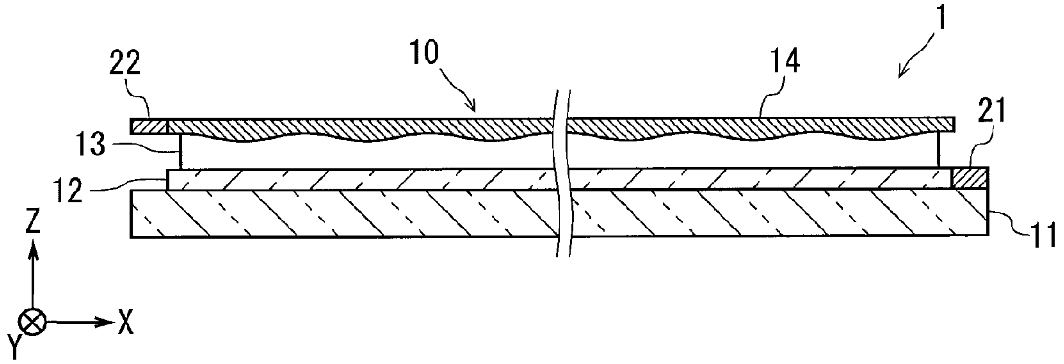
FIG. 2 is a cross-sectional view schematically showing an exemplary configuration of a surface light emitter according to the embodiment.

FIG. 1 is a diagram schematically showing an outline configuration of an illumination device 1 according to an embodiment. FIG. 1 additionally shows a left-handed XYZ coordinate system whose XY plane defines a plane extending in parallel with a part (also referred to as a light-emitting surface) of the illumination device 1 that causes light emission in the shape of a surface. In FIG. 2 and subsequent Figures, for the purpose of clarifying a directional relationship, one or more axes corresponding to any of the three XYZ axes shown in FIG. 1 are provided as necessary.

The illumination device 1 includes a surface light emitter 10 and power feeding portions 21 and 22.

The surface light emitter 10 includes a transparent base plate 11, a lower electrode layer 12, a light emission layer 13, and an upper electrode layer 14. In the surface light emitter 10, the lower electrode layer 12, the light emission layer 13, and the upper electrode layer 14 are laminated in the mentioned order and in spatial sequence on the transparent base plate 11. The lamination of the lower electrode layer 12, the light emission layer 13, and the upper electrode layer 14 on the transparent base plate 11 may be performed through, for example, any of a vapor-deposition process, a sputtering process, and a coating process.

Actually, other layers such as an electron transport layer and a hole transport layer are interposed, for example, between the lower electrode layer 12 and the light emission layer 13 and between the light emission layer 13 and the upper electrode layer 14. However, in this embodiment, these layers are not shown for simplification of the description and illustration.

The transparent base plate 11 is a base plate having a flat plate shape that allows a visible light beam to transmit therethrough, and comprised of, for example glass.

The lower electrode layer 12 is a conductive layer that allows a visible light beam to transmit therethrough, and comprised of, for example, indium tin oxide (ITO).

The upper electrode layer 14 is a conductive layer comprised of, for example, molybdenum or silver, and configured to reflect light emitted by the light emission layer 13.

The light emission layer 13 is a layer configured to emit light when a voltage is applied between the lower electrode layer 12 and the upper electrode layer 14, and comprised of, for example, a luminescent material such as a high-polymer material or a low-polymer material. Herein, when a voltage is applied between the lower electrode layer 12 and the upper electrode layer 14, an electrode of one of the lower electrode layer 12 and the upper electrode layer 14 injects electrons into the light emission layer 13 while an electrode of the other injects holes into the light emission layer 13. At this time, the electrons and the holes are combined in the light emission layer 13, thereby causing light emission.

The power feeding portions 21 and 22 are comprised of a good conductor such as copper. The power feeding portion 21 is electrically connected to the lower electrode layer 12, and the power feeding portion 22 is electrically connected to the upper electrode layer 14. Between the power feeding portion 21 and the power feeding portion 22, a power supply 2 and a switch 3 are electrically connected in sequence.

For example, in a state where the switch 3 does not allow a current to flow (also referred to as an open state), the power supply 2 and the power feeding portion 22 are not electrically connected, so that the power supply 2 applies no voltage between the power feeding portion 21 and the power feeding portion 22. On the other hand, in a state where the switch 3 allows a current to flow (also referred to as a closed state), the power supply 2 and the power feeding portion 22 are electrically connected to each other, so that the power supply 2 applies a voltage between the power feeding portion 21 and the power feeding portion 22.

Accordingly, the surface light emitter 10 emits light in the light emission layer 13, in accordance with the voltage applied by the power supply 2 through the power feeding portions 21 and 22. The light emitted in the light emission layer 13 transmits sequentially through the lower electrode layer 12 and the transparent base plate 11 and then exits to the outside of the transparent base plate 11, as indicated by the downward arrows AR1 in FIG. 1. That is, the light is emitted from one main surface (also referred to as a light-emitting surface) of the transparent base plate 11 having a plane shape, and consequently the light-emitting surface of the surface light emitter 10 causes light emission in the shape of a surface (here, in the shape of a plane).

Here, in the surface light emitter 10, when the light emission layer 13 has an uneven thickness, unevenness in luminance occurs in the light-emitting surface, which may undesirably make a user perceive unevenness in light emission (also referred to as uneven light emission). Therefore, the surface light emitter 10 according to this embodiment adopts a structure (also referred to as an uneven-light-emission suppression structure) adapted to suppress uneven light emission perceived by the user.

<(2) Uneven-Light-Emission Suppression Structure>

FIG. 2 is a cross-sectional view schematically showing an exemplary configuration of the surface light emitter 10 according to the embodiment.

The light emission layer 13 provided between the lower electrode layer 12 and the upper electrode layer 14 has a variation in the thickness thereof, which is spatially periodic with a substantially constant (preferably, constant) amplitude.

For example, when the thickness direction of the light emission layer 13 is a direction (also referred to as a Z-axis direction) along the Z-axis, the light emission layer 13 has a spatially periodic variation in the thickness thereof with a substantially constant amplitude with respect to, as one direction, a direction (also referred to as a X-axis direction) along the X-axis.

Here, for example, the substantially constant amplitude may be a predetermined percentage (for example, 40%) of an average value of the thickness of the light emission layer 13. In the spatially periodic variation in the thickness, for example, the thickness may change in the form of a sine wave in accordance with a position change in the X-axis direction. Furthermore, in the light emission layer 13, portions in the same position with respect to the X-axis direction may have substantially the same thickness irrespective of their positions with respect to a direction (also referred to as a Y-axis direction) along the Y-axis.

Such a variation in the thickness of the light emission layer 13 can be achieved by, for example, forming the light emission layer 13 through a vapor-deposition process or a sputtering process using a metal mask that is shaped in accordance with the spatial periods of the variation in the thickness.

As described above, the light emission layer 13 includes a spatially periodic structure with a substantially constant amplitude. Accordingly, when the surface light emitter 10 emits light, a variation in luminance, which is spatially periodic with a substantially constant (preferably, constant) amplitude, occurs in the light-emitting surface of the surface light emitter 10 in accordance with the periodic structure of the light emission layer 13.

Figure 3:
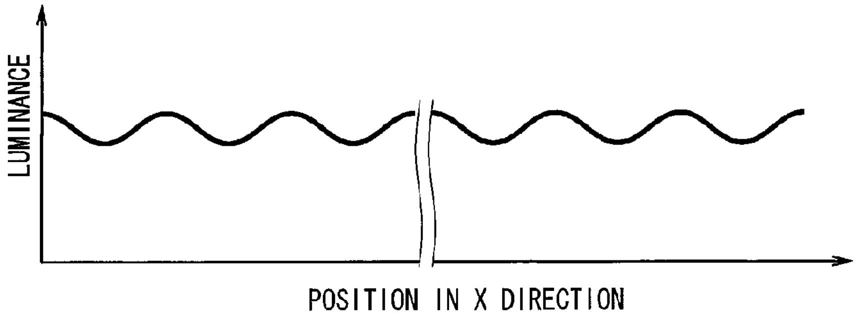
FIG. 3 is a diagram showing a luminance variation of the surface light emitter according to the embodiment.

FIG. 3 is a diagram illustrating the luminance variation occurring in the light-emitting surface of the surface light emitter 10. In FIG. 3, the horizontal axis represents the position with respect to the X direction and the vertical axis represents the luminance. A luminance variation occurring in the light-emitting surface in accordance with a position change with respect to the X direction is indicated by the thick line.

Next, a description will be given to the principle in which uneven light emission is suppressed by such a spatially periodic luminance variation in the light-emitting surface, and conditions suitable for the suppression of uneven light emission.

<(3) Principle of and Conditions Suitable for Suppression of Uneven Light Emission>

In the following, a description will be sequentially given to: (3-1) the relationship between the luminance variation in the light-emitting surface and human perception thereof as uneven light emission; and (3-2) suppression of the uneven light emission by using another luminance variation, and conditions suitable for the suppression.

<(3-1) Relationship between Luminance Variation and Human Perception Thereof as Uneven Light Emission>

Figure 4:
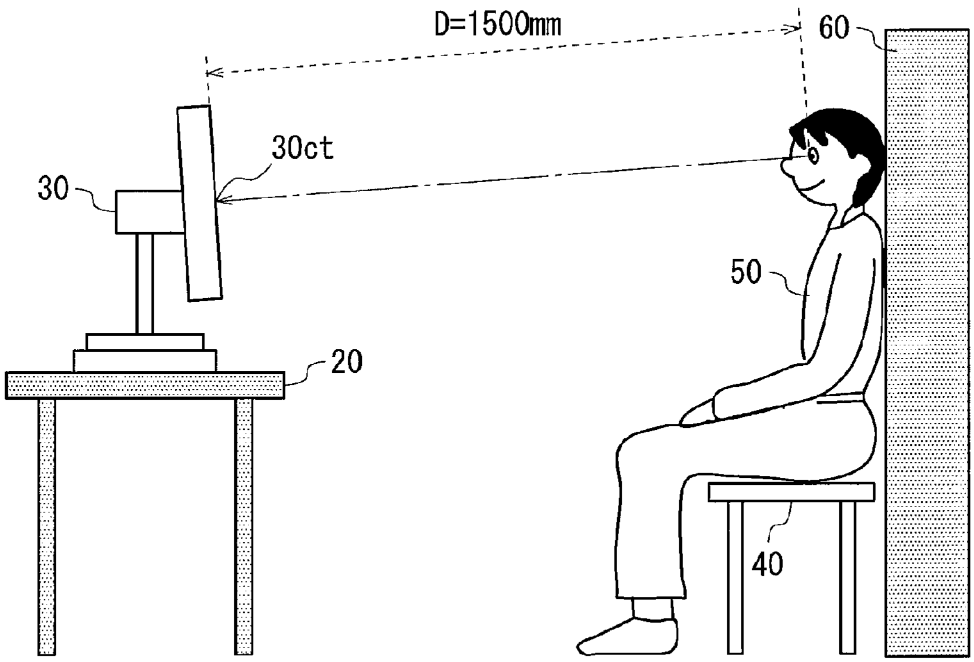
FIG. 4 is a diagram showing conditions of an experiment performed in order to obtain the relationship between a luminance variation and uneven light emission.
Figure 5:
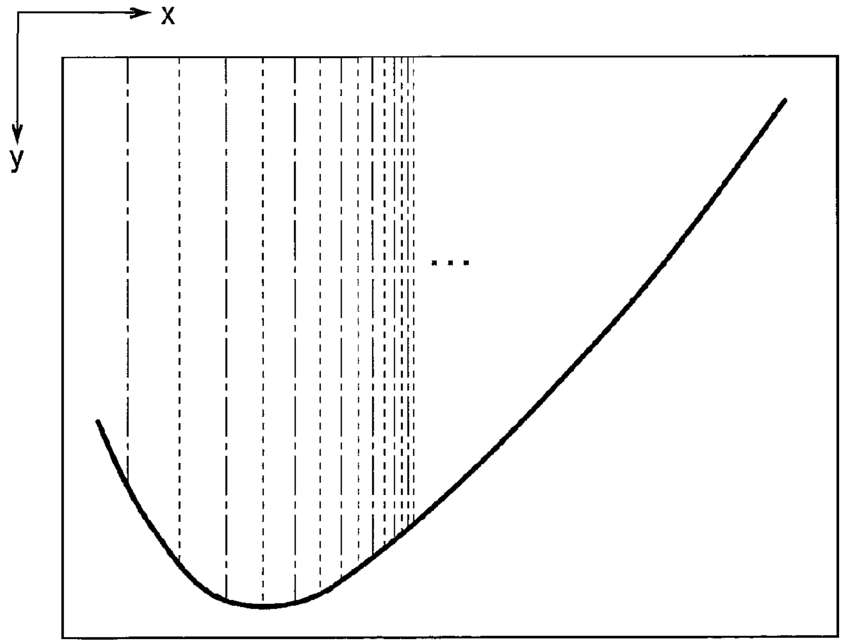
FIG. 5 is a diagram showing the conditions of the experiment performed in order to obtain the relationship between a luminance variation and uneven light emission.

FIGS. 4 and 5 are diagram showing conditions of an experiment performed in order to obtain the relationship between a luminance variation and uneven light emission.

As shown in FIG. 4, a luminance variation was displayed on a screen of a display unit 30. What kind of luminance variation was perceived as uneven luminance by an observer 50 viewing the screen was determined Thereby, the relationship between a luminance variation in the light-emitting surface and human perception thereof as uneven light emission was obtained.

The display unit 30 included a liquid crystal display screen (when appropriate, abbreviated as a screen) including a number of pixels arrayed in a matrix, and was placed on a desk 20 so that the position and attitude thereof were fixed. The screen was substantially planar and had a rectangular outer edge with a width of 473 mm and a diagonal dimension of 22 inches, in which 1920 pixels were arrayed in the horizontal direction and 1200 pixels were arrayed in the vertical direction.

In the experiment, the observer 50 sat on a chair 40 while being opposed in front of the screen, and kept the back and the back of the head in contact with a wall 60, thereby the position and attitude were held constant. A line segment connecting the centers of gravity of the pupils of both eyes of the observer 50 to each other was substantially in parallel with the horizontal direction of the screen. A line segment connecting a center point 30 ct of the screen to the midpoint of the line segment connecting the centers of gravity of the pupils of both eyes of the observer 50 was substantially coincident with the normal of the screen, and had a length of 1500 mm.

As shown in FIG. 5, the pixel at the upper left of the screen was defined as the origin, the rightward direction in the screen was defined as the X direction, and the downward direction in the screen was defined as the Y direction. A pattern of vertical stripes (also referred to as a vertical stripe pattern) representing a luminance variation in which the spatial frequency increases along the X direction and the amplitude decreases along the Y direction was displayed on the screen.

In FIG. 5, a region where the luminance exhibits a local minimum value is indicated by an alternate long and short dash line, and a region where the luminance exhibits a local maximum value is indicated by a broken line. In FIG. 5, the interval of the vertical stripe pattern decreases along the X direction, but the illustration of the vertical stripe pattern is omitted in a portion where the interval of the vertical stripe pattern is too small to be illustrated. Moreover, the illustration of the vertical stripe pattern is also omitted in a portion where the vertical stripe pattern is invisible.

As for increase and decrease in luminance along the X direction, for example, the one represented by a sine wave (sign curve) in which a space frequency (also referred to as a spatial frequency) increases along the X direction was adopted. The spatial frequency corresponds to the number of times the increase and decrease in luminance are repeated at a viewing angle of 1° for the observer 50. The unit thereof is represented by cpd (cycles per degree), which means the number of cycles per 1°.

For example, the spatial frequency of the vertical stripe pattern was set to be a fixed multiple of $10^{-X}$, and the amplitude of the vertical stripe pattern was set to be a fixed multiple of $10^{-y}$. More specifically, the amplitude in a case of y=0 was set to be 0.4 times a predetermined luminance as a reference. Then, under conditions that a maximum luminance value corresponding to white was 350 cd/$m^2$, the predetermined luminance was set to be 100 cd/$m^2$ which is a luminance corresponding to gray. That is, in a case of y=0, the luminance was varied in a range of 80 to 120 cd/$m^2$.

Such a vertical stripe pattern was displayed on the screen, and in this state the observer 50 identifies, on the screen, a boundary between a region where the presence of the vertical stripe pattern was visible and a region where it was invisible. Then, a line marking the boundary (also referred to as a boundary line) was added on the screen. In FIG. 5, the boundary line is indicated by the thick-line curve. The boundary line represents the relationship between the spatial frequency and a visible amplitude.

Figure 6:
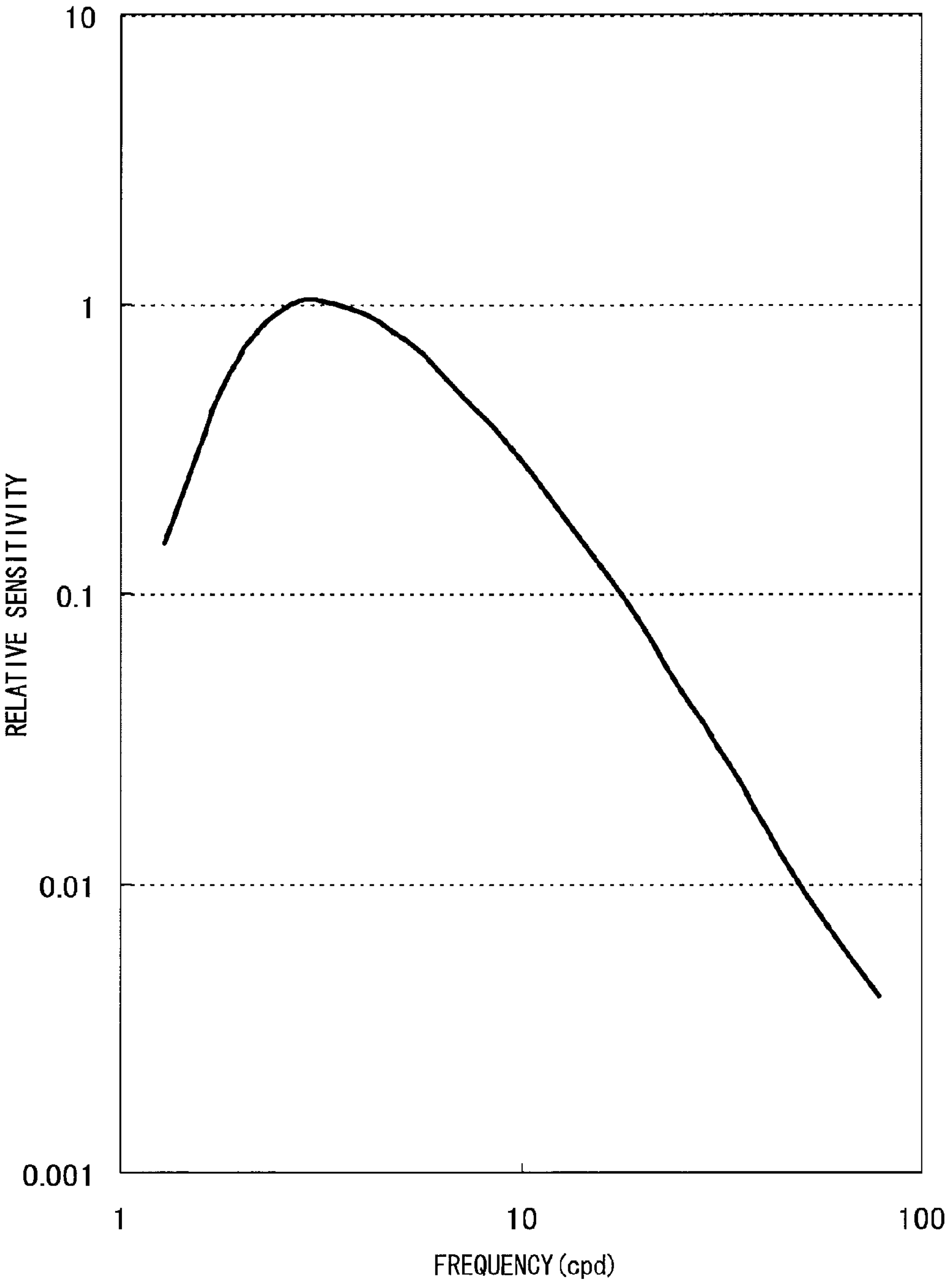
FIG. 6 is a diagram showing the relationship of the amplitude and the spatial frequency relative to the sensitivity in a luminance variation.

Here, with respect to each spatial frequency, the inverse of a minimum value of the visible amplitude was obtained as the sensitivity. Furthermore, each sensitivity was divided by a maximum value of sensitivity (also referred to as maximum sensitivity), thus performing normalization. Thereby, comparative sensitivity (also referred to as relative sensitivity) was obtained with respect to each spatial frequency. As a result, a relationship indicated by the thick-line curve in FIG. 6 was obtained as the relationship between the spatial frequency and the relative sensitivity of the vertical stripe pattern. In FIG. 6, the horizontal axis represents the spatial frequency, and the vertical axis represents the relative sensitivity.

As shown in FIG. 6, it was revealed that, in the human visual sense, the sensitivity to increase and decrease in luminance varies in accordance with the number of times (spatial frequency) the increase and decrease in luminance are repeated at a viewing angle of 1°. To be specific, the relative sensitivity reaches its peak when the spatial frequency is in a range of 2 to 6 cpd, and the sensitivity is lost when the spatial frequency is around 100 cpd. From another viewpoint, even in a luminance variation having the same amplitude, a luminance variation with respect to an intermediate spatial frequency (here, 2 to 100 cpd) is visually observed while a luminance variation with respect to a higher spatial frequency (exceeding 100 cpd) is not visually observed.

<(3-2) Suppression of Uneven Light Emission by using Another Luminance Variation and Conditions Suitable for Suppression>

Figure 7:
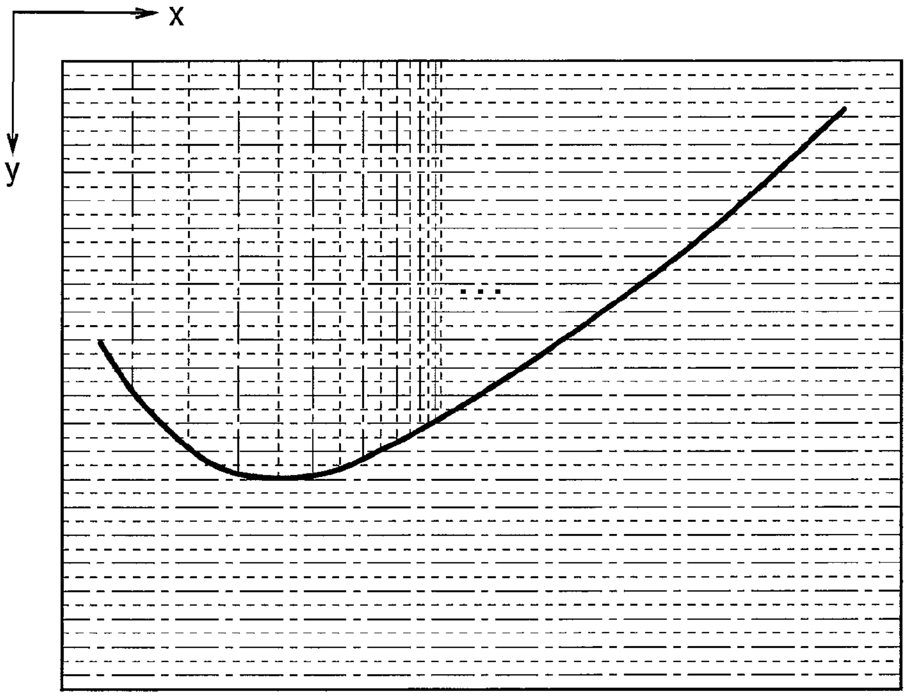
FIG. 7 is a diagram showing conditions of an experiment performed in order to obtain an influence exerted on the sensitivity to one luminance variation by another luminance variation.

FIG. 7 is a diagram showing conditions of an experiment performed in order to obtain an influence exerted on the sensitivity to one luminance variation by another luminance variation.

Here, as for the display unit 30 and the observer 50, the same conditions as those shown in FIG. 4 were adopted. Additionally, as shown in FIG. 7, on the screen of the display unit 30, the luminance variation shown in FIG. 5 (also referred to as a first luminance variation) was displayed, and furthermore a luminance variation (also referred to as a second luminance variation) different from the first luminance variation was superimposed. Then, the relationship was obtained between a boundary of whether or not the observer 50 viewing the screen perceived the first luminance variation as uneven luminance and the spatial frequency of the second luminance variation.

As for the second luminance variation, as shown in FIG. 7, a pattern of horizontal stripes (also referred to as a horizontal stripe pattern) representing a luminance variation represented by a sine wave was adopted, in which the luminance increases or decreases along the Y direction and which has a predetermined amplitude and a predetermined spatial frequency.

In FIG. 7, similarly to FIG. 5, in each of the first and second luminance variations, a region where the luminance exhibits a local minimum value is indicated by an alternate long and short dash line and a region where the luminance exhibits a local maximum value is indicated by a broken line. In the first luminance variation, the illustration of the vertical stripe pattern is omitted in a portion where the interval of the vertical stripe pattern is too small to be illustrated. Moreover, the illustration of the vertical stripe pattern is also omitted in a portion where the vertical stripe pattern is invisible.

As for the spatial frequency of the horizontal stripe pattern, ten frequencies, namely, 1, 2, 3, 5, 10, 20, 30, 50, 100, and 150 cpd, were sequentially adopted. As for the amplitude of luminance of the horizontal stripe pattern representing the second luminance variation, a constant luminance amplitude was adopted irrespective of a position with respect to the X direction. Here, as for the constant luminance amplitude, a range of 40 cd/$m^2$ centered at 100 cd/$m^2$ corresponding to gray was adopted. That is, the luminance of the horizontal stripe pattern was varied in a range of 80 to 120 cd/$m^2$.

In this state where the vertical stripe pattern having the horizontal stripe pattern superimposed thereon was displayed on the screen, the observer 50 identified, on the screen, a boundary between a region where the presence of the vertical stripe pattern was visible and a region where it was invisible. Then, a line marking the boundary (boundary line) was added on the screen. In FIG. 7, an example of the boundary line is indicated by the thick-line curve. The boundary line represents the relationship between the spatial frequency and a visible amplitude.

Figure 8:
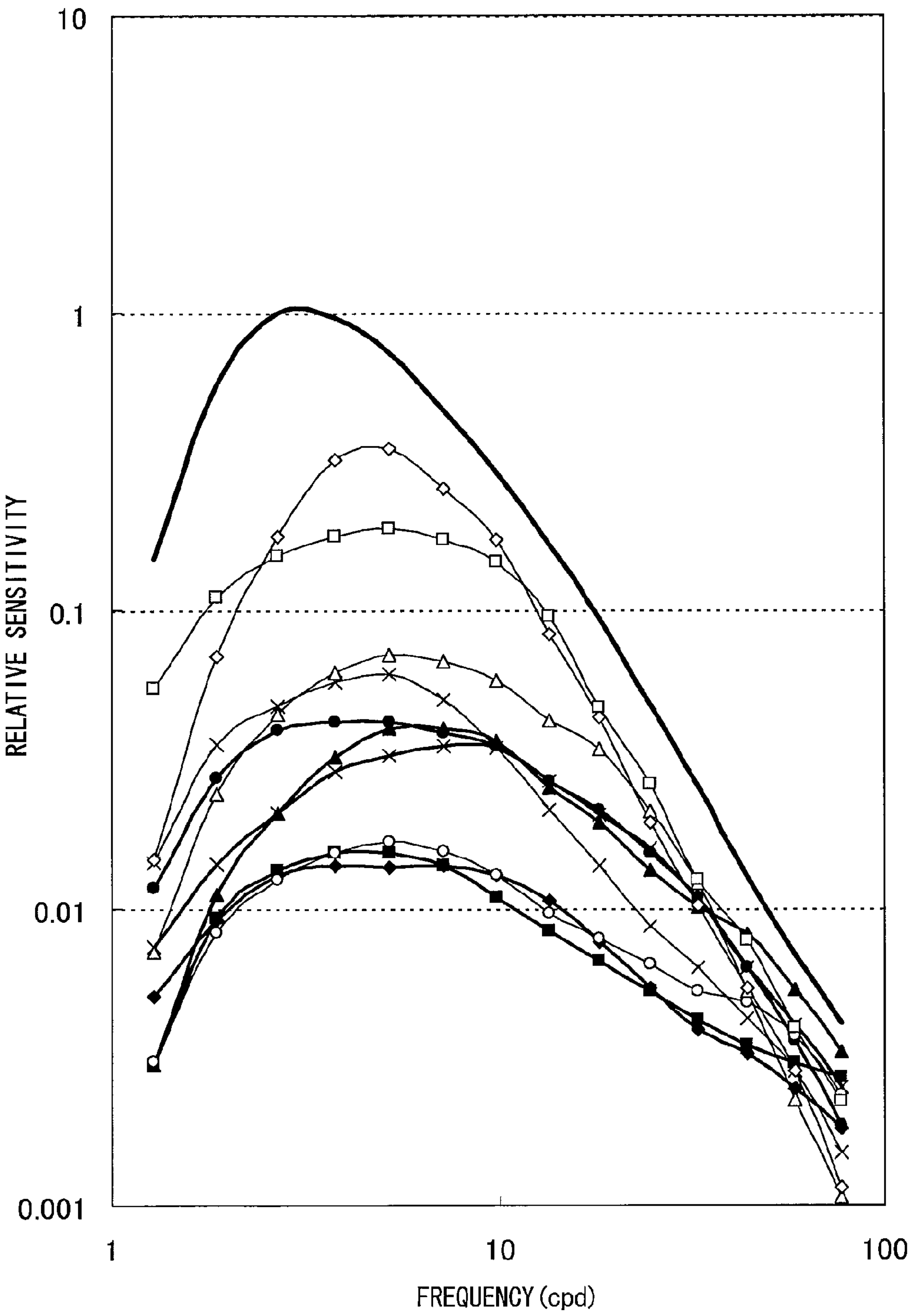
FIG. 8 is a diagram showing an influence exerted on the sensitivity to one luminance variation by another luminance variation.

Here, with respect to each spatial frequency of the horizontal stripe pattern, the inverse of a minimum value of the visible amplitude was obtained as the sensitivity with respect to each spatial frequency of the vertical stripe pattern. Furthermore, each sensitivity was divided by a maximum value of sensitivity (also referred to as maximum sensitivity) obtained in a case where the horizontal stripe pattern was not superimposed, thus performing normalization. Thereby, relative sensitivity was obtained. As a result, a relationship shown in FIG. 8 was obtained as the relationship between the spatial frequency and the relative sensitivity of the vertical stripe pattern with respect to each spatial frequency of the horizontal stripe pattern. In FIG. 8, the horizontal axis represents the spatial frequency, and the vertical axis represents the relative sensitivity.

In FIG. 8, the relationship between the spatial frequency and the relative sensitivity of the vertical stripe pattern obtained in a case where the horizontal stripe pattern shown in FIG. 6 was not superimposed thereon, is indicated by the thick-line curve.

In FIG. 8, the relationship between the spatial frequency and the relative sensitivity of the vertical stripe pattern obtained in a case where the spatial frequency of the horizontal stripe pattern was 1 cpd is indicated by "the combination of black circle marks and a solid-line curve". The relationship between the spatial frequency and the relative sensitivity of the vertical stripe pattern obtained in a case where the spatial frequency of the horizontal stripe pattern was 2 cpd is indicated by "the combination of cross marks and a solid-line curve". The relationship between the spatial frequency and the relative sensitivity of the vertical stripe pattern obtained in a case where the spatial frequency of the horizontal stripe pattern was 3 cpd is indicated by "the combination of black triangle marks and a solid-line curve". The relationship between the spatial frequency and the relative sensitivity of the vertical stripe pattern obtained in a case where the spatial frequency of the horizontal stripe pattern was 5 cpd is indicated by "the combination of black diamond marks and a solid-line curve".

In FIG. 8, the relationship between the spatial frequency and the relative sensitivity of the vertical stripe pattern obtained in a case where the spatial frequency of the horizontal stripe pattern was 10 cpd is indicated by "the combination of black square marks and a solid-line curve". The relationship between the spatial frequency and the relative sensitivity of the vertical stripe pattern obtained in a case where the spatial frequency of the horizontal stripe pattern was 20 cpd is indicated by "the combination of white circle marks and a thin-line curve". The relationship between the spatial frequency and the relative sensitivity of the vertical stripe pattern obtained in a case where the spatial frequency of the horizontal stripe pattern was 30 cpd is indicated by "the combination of cross marks and a thin-line curve". The relationship between the spatial frequency and the relative sensitivity of the vertical stripe pattern obtained in a case where the spatial frequency of the horizontal stripe pattern was 50 cpd is indicated by "the combination of white triangles and a thin-line curve".

In FIG. 8, the relationship between the spatial frequency and the relative sensitivity of the vertical stripe pattern obtained in a case where the spatial frequency of the horizontal stripe pattern was 100 cpd is indicated by "the combination of white diamond marks and a thin-line curve". The relationship between the spatial frequency and the relative sensitivity of the vertical stripe pattern obtained in a case where the spatial frequency of the horizontal stripe pattern was 150 cpd is indicated by "the combination of white square marks and a thin-line curve".

As shown in FIG. 8, it was revealed that superimposing the horizontal stripe pattern on the vertical stripe pattern reduces the relative sensitivity in the perception of the vertical stripe pattern. It was therefore revealed that intentionally generating the horizontal stripe pattern causes an effect (also referred to as a masking effect) for suppressing uneven light emission occurring due to the vertical stripe pattern. Particularly, the masking effect is prominently exerted on a luminance variation in an intermediate spatial frequency range (here, around 2 to 6 cpd) in which the relative sensitivity to the vertical stripe pattern increases in a case where the horizontal stripe pattern is not superimposed.

The masking effect is obtained not only when a vertical stripe pattern and a horizontal stripe pattern whose spatial frequencies are close to each other are superimposed, but also when a vertical stripe pattern and a horizontal stripe pattern whose spatial frequencies are largely different from each other are superimposed.

Here, a luminance variation having a constant amplitude and a constant spatial frequency, such as the second luminance variation, is perceived as a luminance variation that is intentionally generated. The observer 50 does not perceive it as uneven light emission. Accordingly, in the illumination device 1, even though uneven luminance occurs due to, for example, an uneven thickness of the light emission layer 13, which may be caused in a manufacturing process, and conditions of use thereof, a perception of such uneven luminance as uneven light emission can be suppressed by generating an intentional luminance variation.

Figure 9:
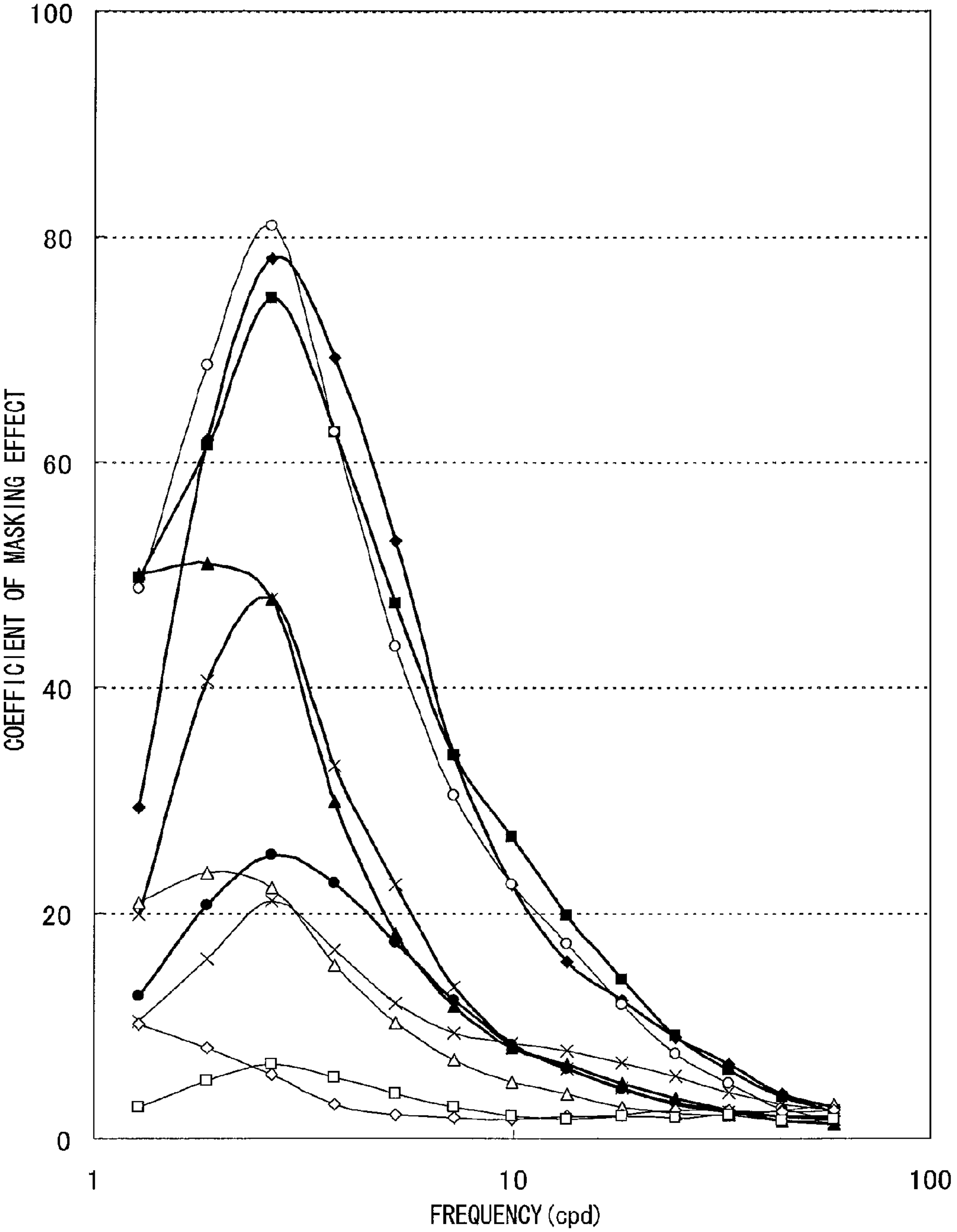
FIG. 9 is a diagram showing the relationship between the spatial frequency of a luminance variation and the coefficient of a masking effect.

FIG. 9 is a diagram showing the relationship between the spatial frequency and the degree of the masking effect in the vertical stripe pattern with respect to each spatial frequency of the horizontal stripe pattern. In FIG. 9, the horizontal axis represents the spatial frequency, and the vertical axis represents the coefficient of the masking effect, which is a numerical value indicating the degree of the masking effect. The coefficient of the masking effect was derived by, with respect to each spatial frequency of the horizontal stripe pattern, dividing the relative sensitivity at each spatial frequency of the vertical stripe pattern obtained in a case where the horizontal stripe pattern was not superimposed thereon, by the relative sensitivity at the corresponding spatial frequency of the vertical stripe pattern obtained in a case where the horizontal stripe pattern was superimposed thereon.

In FIG. 9, the relationship between the spatial frequency of the vertical stripe pattern and the coefficient of the masking effect obtained in a case where the spatial frequency of the horizontal stripe pattern was 1 cpd is indicated by "the combination of black circle marks and a solid-line curve". The relationship between the spatial frequency of the vertical stripe pattern and the coefficient of the masking effect obtained in a case where the spatial frequency of the horizontal stripe pattern was 2 cpd is indicated by "the combination of cross marks and a solid-line curve". The relationship between the spatial frequency of the vertical stripe pattern and the coefficient of the masking effect obtained in a case where the spatial frequency of the horizontal stripe pattern was 3 cpd is indicated by "the combination of black triangle marks and a solid-line curve". The relationship between the spatial frequency of the vertical stripe pattern and the coefficient of the masking effect obtained in a case where the spatial frequency of the horizontal stripe pattern was 5 cpd is indicated by "the combination of black diamond marks and a solid-line curve".

In FIG. 9, the relationship between the spatial frequency of the vertical stripe pattern and the coefficient of the masking effect obtained in a case where the spatial frequency of the horizontal stripe pattern was 10 cpd is indicated by "the combination of black square marks and a solid-line curve". The relationship between the spatial frequency of the vertical stripe pattern and the coefficient of the masking effect obtained in a case where the spatial frequency of the horizontal stripe pattern was 20 cpd is indicated by "the combination of white circle marks and a thin-line curve". The relationship between the spatial frequency of the vertical stripe pattern and the coefficient of the masking effect obtained in a case where the spatial frequency of the horizontal stripe pattern was 30 cpd is indicated by "the combination of cross marks and a thin-line curve". The relationship between the spatial frequency of the vertical stripe pattern and the coefficient of the masking effect obtained in a case where the spatial frequency of the horizontal stripe pattern was 50 cpd is indicated by "the combination of white triangles and a thin-line curve".

In FIG. 9, furthermore, the relationship between the spatial frequency of the vertical stripe pattern and the coefficient of the masking effect obtained in a case where the spatial frequency of the horizontal stripe pattern was 100 cpd is indicated by "the combination of white diamond marks and a thin-line curve". The relationship between the spatial frequency of the vertical stripe pattern and the coefficient of the masking effect obtained in a case where the spatial frequency of the horizontal stripe pattern was 150 cpd is indicated by "the combination of white square marks and a thin-line curve".

As shown in FIG. 9, when the spatial frequency of the horizontal stripe pattern is in a range of 5 to 20 cpd, a relatively high coefficient of the masking effect is obtained. In other words, from the viewpoint of obtaining a high masking effect, it is preferable that the spatial frequency of the horizontal stripe pattern is within a range of 5 to 20 cpd. As indicated by the thick-line curves in FIGS. 6 and 8, from the viewpoint of making it more difficult for the observer 50 to perceive the horizontal stripe pattern, it is more preferable that the spatial frequency of the horizontal stripe pattern is within a range of 10 to 20 cpd, and it is further preferable that the spatial frequency of the horizontal stripe pattern is 20 cpd.

In another point of view, from the results of the experiment for the relationship between the luminance variation and human perception as uneven light emission, which have been described with reference to FIGS. 4 to 6, the relationship between the spatial frequency of the vertical stripe pattern and a minimum value of the amplitude of the vertical stripe pattern that is perceived as uneven light emission by the observer 50 is obtained. The minimum value of the amplitude of the vertical stripe pattern is also called a JND (Just Noticeable Difference) of unevenness. A relationship indicated by a thick-line curve in FIG. 10 was obtained as the relationship between the spatial frequency of the vertical stripe pattern and the JND of unevenness.

Figure 10:
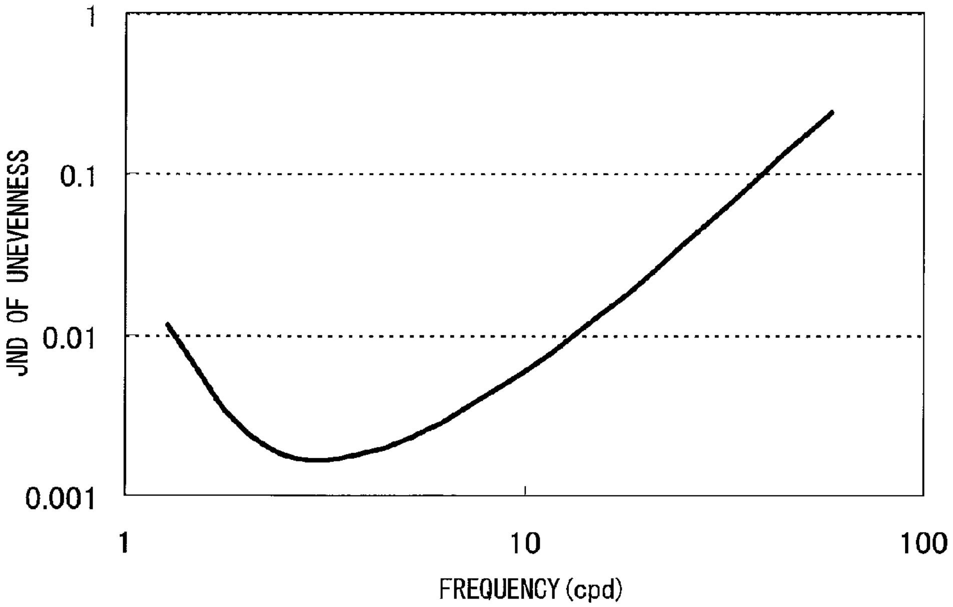
FIG. 10 is a diagram showing the relationship between a lower limit value of the amplitude and the spatial frequency of a luminance variation that causes a perception of uneven light emission.

In FIG. 10, the horizontal axis represents the spatial frequency of the vertical stripe pattern, and the vertical axis represents the amplitude of the vertical stripe pattern. The amplitude that is coincident with the luminance (here, 100 $cd/m^2$) at the center of the amplitude of the vertical stripe pattern is set to be a reference value (here, 1) of the JND of unevenness.

As shown in FIG. 10, at the spatial frequency of a luminance variation at which the sensitivity of human eyes is highest, that is, at the spatial frequency of the vertical stripe pattern at which the JND of unevenness is smallest, this JND of unevenness was about 0.0017. In an organic EL device, it is significantly difficult to suppress luminance variation to 2% or less, though depending on a manufacturing method. Therefore, it is preferable to adopt such conditions that the JND of unevenness exceeds 0.02 which corresponds to a luminance variation of 2%. In order that the JND of unevenness exceeds 0.02, it is necessary that the JND of unevenness is increased by about 12 times (=0.02/0.0017) with respect to the spatial frequency of the luminance variation at which the sensitivity of human eyes is highest.

Figure 11:
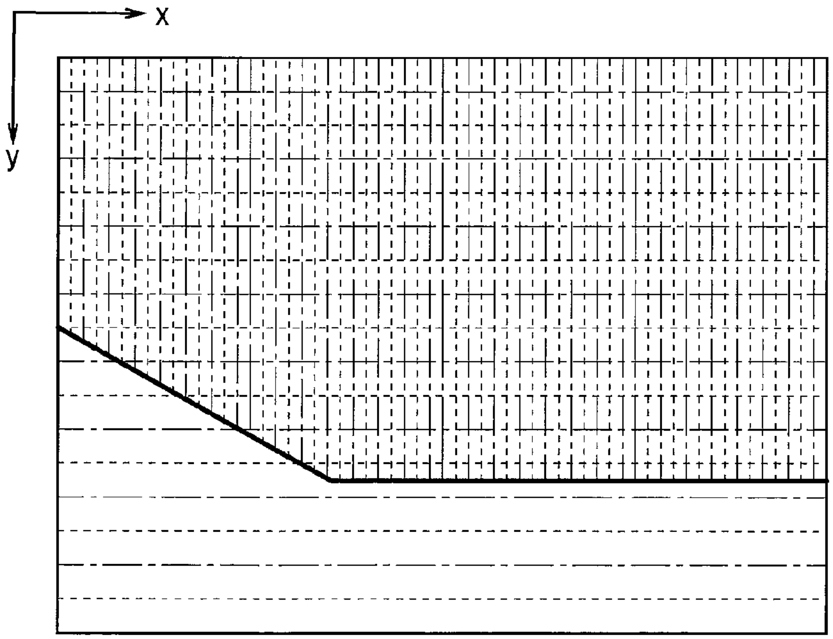
FIG. 11 is a diagram showing the relationship between the lower limit value of the amplitude of the luminance variation that causes a perception of uneven light emission and the amplitude of a luminance variation that is superimposed.

Here, in another experiment, as shown in FIG. 11, a vertical stripe pattern and a horizontal stripe pattern were superimposed on each other, on the screen of the display unit 30. The vertical stripe pattern is represented by a sine wave in which increase and decrease in luminance along the X direction have an amplitude of a fixed multiple of $10^{-X}$ and a constant spatial frequency. The horizontal stripe pattern is represented by a sine wave in which increase and decrease in luminance along the Y direction have an amplitude of a fixed multiple of $10^{-y}$ and a constant spatial frequency. At this time, the observer 50 identified, on the screen, a boundary line between a region where the presence of the vertical stripe pattern was visible and a region where it was invisible, as indicated by the thick line in FIG. 11. As shown in FIG. 11, it was revealed that, in the boundary line, the amplitude of the vertical stripe pattern and the amplitude of the horizontal stripe pattern are proportionate to each other until the amplitude of the vertical stripe pattern becomes too small.

As shown in FIG. 9, it was revealed that, at the spatial frequency of the luminance variation where the sensitivity of human eyes is highest, the coefficient of the masking effect is increased by about 80 times and the JND of unevenness is increased by 80 times when a horizontal stripe pattern whose spatial frequency is 20 cpd and whose amplitude centered at a predetermined luminance is 0.4 times this predetermined luminance is superimposed on the vertical stripe pattern.

In order to increase the JND of unevenness by about 12 times, it may be conceivable to adopt conditions that the spatial frequency of the horizontal stripe pattern is 20 cpd and the amplitude thereof is about 0.06 times (=0.4×12/80) the predetermined luminance. However, actually in an organic EL device, a situation where a luminance variation is about 10% may often occur, though depending on a manufacturing method. In order to increase the JND of unevenness by about 60 times (=0.1/0.0017), it may be conceivable to adopt conditions that the spatial frequency of the horizontal stripe pattern is 20 cpd and the amplitude thereof is about 0.3 times (=0.4×60/80) the predetermined luminance.

That is, in order to suppress uneven light emission, for example, it is preferable that a luminance variation that is intentionally generated has a spatial frequency of 20 cpd and an amplitude exceeds about 0.3 times the predetermined luminance that is at the center of this amplitude.

In a case where the illumination device 1 is a tabletop illumination device, in general, the eyes of the user are distant from the surface light emitter 10 by about 40 to 100 cm. In a case where the illumination device 1 is an illumination device provided on a ceiling, in general, the eyes of the user are distant from the surface light emitter 10 by about 100 to 300 cm. Therefore, it is preferable that, in accordance with uses of the illumination device 1, the number of times (the unit is cycle/cm, for example) a luminance variation occurs per unit length in the surface light emitter 10 is set such that the spatial frequency of the luminance variation is 5 to 20 cpd.

<(4) Conclusion of Embodiment>

As described above, in the illumination device 1 according to the embodiment, a spatially periodic luminance variation having a substantially constant amplitude is intentionally achieved. This can suppress uneven light emission that the user may perceive. Particularly, when the luminance variation intentionally generated has a spatial frequency of 5 to 20 cpd, the uneven light emission that the user may perceive can be efficiently suppressed.

Since the light emission layer 13 interposed between the lower electrode layer 12 and the upper electrode layer 14 is configured to have a spatially periodic thickness variation with a substantially constant amplitude, a spatially periodic luminance variation with a substantially constant amplitude is intentionally generated. Accordingly, the uneven light emission that the user may perceive can be suppressed with a relatively simple configuration.

<(5) Modification>

The present invention is not limited to the above-described embodiment. Various modifications, improvements, and the like, may be made without departing from the spirit of the present invention.

For example, although in the embodiment described above, a spatially periodic luminance variation having a substantially constant amplitude is intentionally achieved by means of a variation in the thickness of the light emission layer 13, this is not limiting. For example, a spatially periodic luminance variation having a substantially constant amplitude can be intentionally achieved by means of other configurations. In the following, specific examples (first to fourth modifications) of the other configurations will be described.

<(5-1) First Modification>

Figure 12:
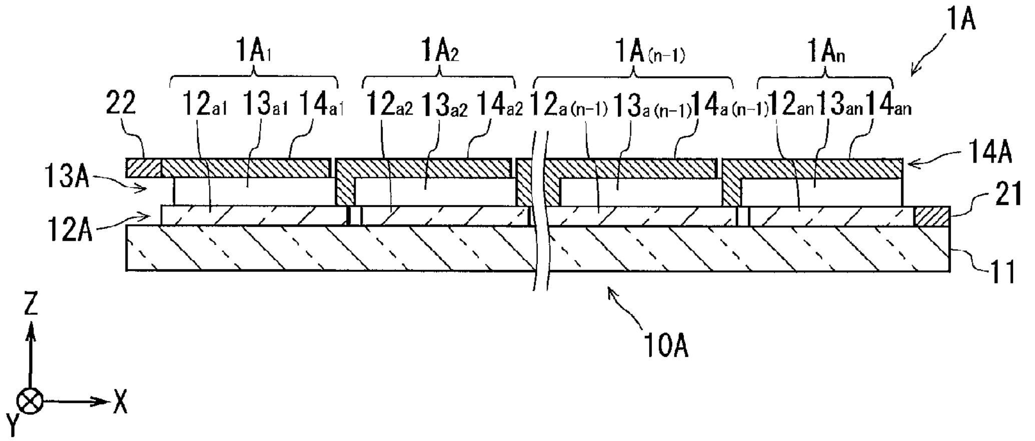
FIG. 12 is a cross-sectional view showing an exemplary configuration of a surface light emitter according to a first modification.

FIG. 12 is a cross-sectional view schematically showing an exemplary configuration of a surface light emitter 10A of an illumination device 1A according to a first modification. The surface light emitter 10A is basically identical to the surface light emitter 10 according to the embodiment described above, except that the lower electrode layer 12, the light emission layer 13, and the upper electrode layer 14 are replaced with a lower electrode layer 12A, a light emission layer 13A, and a upper electrode layer 14A, respectively.

The lower electrode layer 12A includes a plurality of lower electrode layers (also referred to as divided lower electrode layers) $\mathbf{12}_{a1}$ to $\mathbf{12}_{an}$ that are configured by the lower electrode layer 12 according to the embodiment described above being divided at predetermined intervals into n (n is a natural number equal to or greater than two) parts. Each pair of neighboring ones of the divided lower electrode layer $\mathbf{12}_{a1}$ to $\mathbf{12}_{an}$ are separated from each other, and not electrically connected.

The light emission layer 13A includes a plurality of light emission layers (also referred to as divided light emission layers) $\mathbf{13}_{a1}$ to $\mathbf{13}_{an}$ that are configured by the light emission layer 13 according to the embodiment described above being divided at predetermined intervals. Each pair of neighboring ones of the divided light emission layer $\mathbf{13}_{a1}$ to $\mathbf{13}_{an}$ are separated from each other.

The upper electrode layer 14A includes a plurality of upper electrode layers (also referred to as divided upper electrode layer) $\mathbf{14}_{a1}$ to $\mathbf{14}_{an}$ that are configured by the upper electrode layer 14 according to the embodiment described above being divided at predetermined intervals. Each pair of neighboring ones of the divided upper electrode layer $\mathbf{14}_{a1}$ to $\mathbf{14}_{an}$ are separated from each other, and not electrically connected.

The divided lower electrode layer $\mathbf{12}_{a1}$, the divided light emission layer $\mathbf{13}_{a1}$, and the divided upper electrode layer $\mathbf{14}_{a1}$ are laminated in this order, into a single light-emittable part (also referred to as a light emission unit) $\mathbf{1}A_1$. Here, when the arbitrary natural number in a range of 1 to n is defined as N, the divided lower electrode layer $\mathbf{12}_{aN}$, the divided light emission layer $\mathbf{13}_{aN}$, and the divided upper electrode layer $\mathbf{14}_{aN}$ are laminated in this order into a single light emission unit $\mathbf{1}A_N$.

That is, the surface light emitter 10A is structured such that n light emission units $\mathbf{1}A_1$ to $\mathbf{1}A_n$ are sequentially arranged along one direction (here, along the X direction) on the other main surface (here, the surface at the +Z side) of the transparent base plate 11. To be specific, the n light emission units $\mathbf{1}A_1$ to $\mathbf{1}A_n$ are arranged along the X direction in a spatially periodic manner.

When the arbitrary natural number in a range of 1 to (n−1) is defined as M, in each pair of light emission units neighboring each other in the X direction among the n light emission units $\mathbf{1}A_1$ to $\mathbf{1}A_n$, one end portion (the end portion at the +X side) of the divided lower electrode layer $\mathbf{12}_{aM}$, which belongs to one light emission unit $\mathbf{1}A_M$, is electrically connected to one end portion (the end portion at the −X side) of the divided upper electrode layer $14_{a(M+1)}$, which belong to the other light emission unit $1A_{M+1}$.

To be specific, each divided upper electrode layer $14_{aN}$ includes a portion (also referred to as a planar arrayed portion) that is planarly arrayed on one main surface (the surface at the +Z side) of the divided light emission layer $13_{aN}$, and a portion (also referred to as a falling-down portion) that is provided at the −X side and falls down in the −Z direction from the planar arrayed portion. The falling-down portion of each divided upper electrode layer $14_{a(M+1)}$ serves as one end portion that is electrically connected to one end portion of the divided lower electrode layer $12_{aM}$.

The power feeding portion 21 is electrically connected to one end portion (the end portion at the +X side) of the divided lower electrode layer $12_{an}$, and the power feeding portion 22 is electrically connected to one end portion (the end portion at the −X side) of the divided upper electrode layer $14_{a1}$. Accordingly, when a voltage is applied between the power feeding portion 21 and the power feeding portion 22, a voltage is applied, in each light emission unit $1A_N$, between one end portion (the end portion at the +X side) of the divided lower electrode layer $12_{aN}$ and one end portion (the end portion at the −X side) of the divided upper electrode layer $14_{aN}$.

In each light emission unit $1A_N$, the electrical resistance of the divided lower electrode layer $12_{aN}$ in one direction (here, in the +X direction) is set higher than the electrical resistance of the divided upper electrode layer $14_{aN}$ in one direction (here, in the +X direction). Such setting of the electrical resistance is achieved by, for example, appropriately adjusting at least one of the thickness and the material of each divided upper electrode layer $14_{aN}$ and each divided lower electrode layer $12_{aN}$. An adjustment of the thickness of a layer is achieved by, for example, a film formation time period in a vapor-deposition process, a sputtering process, or the like. A change of the material of a layer is achieved by, for example, changing a target material in a sputtering process.

In the illumination device 1A according to the first modification including the above-described configuration, when a voltage is applied between the power feeding portion 21 and the power feeding portion 22, a voltage is applied between the divided lower electrode layer $12_{aN}$ and the divided upper electrode layer $14_{aN}$ having the divided light emission layer $13_{aN}$ interposed therebetween in each light emission unit $1A_N$. At this time, in each light emission unit $1A_N$, the voltage applied between the divided lower electrode layer $12_{aN}$ and the divided upper electrode layer $14_{aN}$ drops at a location farther from one end portion (here, the +X side) and closer to the other end portion (here, at the −X side), due to a relatively high electrical resistance of the divided lower electrode layer $12_{aN}$.

When the surface light emitter 10A emits light, a spatially periodic luminance variation having a substantially constant amplitude occurs in the light-emitting surface of the surface light emitter 10A in accordance with the voltage drop in each light emission unit $1A_N$.

Figure 13:
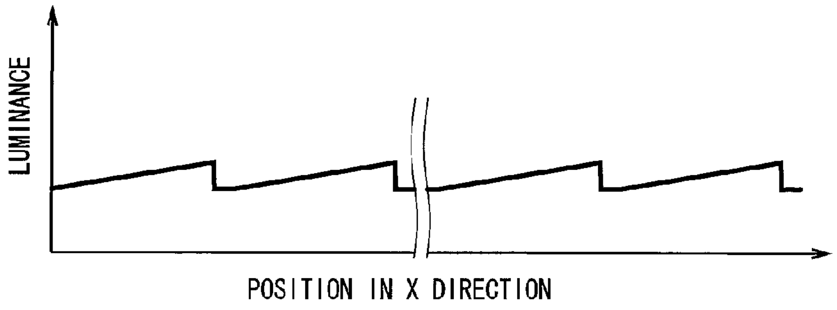
FIG. 13 is a diagram showing a luminance variation occurring in the surface light emitter according to the first modification.

FIG. 13 is a diagram illustrating a luminance variation occurring in the light-emitting surface of the surface light emitter 10A. In FIG. 13, the horizontal axis represents a position in the X direction, and the vertical axis represents the luminance. A luminance variation occurring in the light-emitting surface along with a position change in the X direction is indicated by the thick line.

As described above, also in the illumination device 1A according to the first modification, similarly to the illumination device 1 according to the embodiment described above, uneven light emission that the user may perceive can be suppressed with a relatively simple configuration.

A similar effect is obtained also when, in each light emission unit $1A_N$, the electrical resistance of the divided upper electrode layer $14_{aN}$ in one direction (here, in the +X direction) is set higher than the electrical resistance of the divided lower electrode layer $12_{aN}$ in one direction (here, in the +X direction).

<(5-2) Second Modification>

Figure 14:
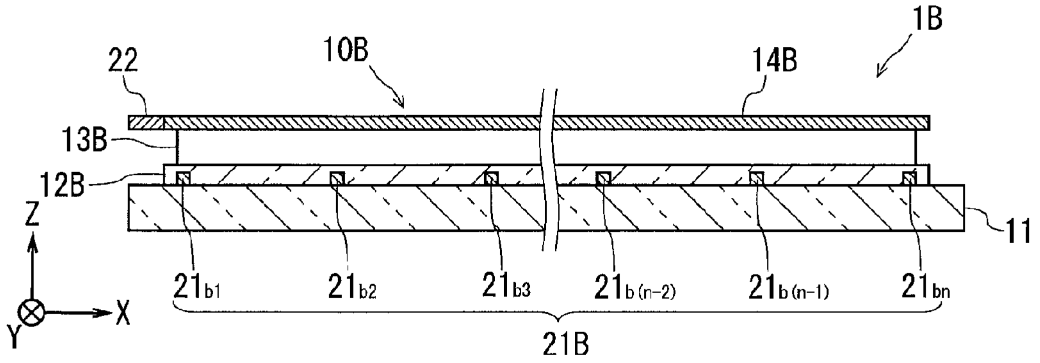
FIG. 14 is a cross-sectional view showing an exemplary configuration of a surface light emitter according to a second modification.

FIG. 14 is a cross-sectional view schematically showing an exemplary configuration of a surface light emitter 10B of an illumination device 1B according to a second modification. The surface light emitter 10B is basically identical to the surface light emitter 10 according to the embodiment described above, except that the lower electrode layer 12, the light emission layer 13, the upper electrode layer 14, and the power feeding portion 21 are replaced with a lower electrode layer 12B, a light emission layer 13B, an upper electrode layer 14B, and a power feeding portion 21B, respectively.

Figure 15:
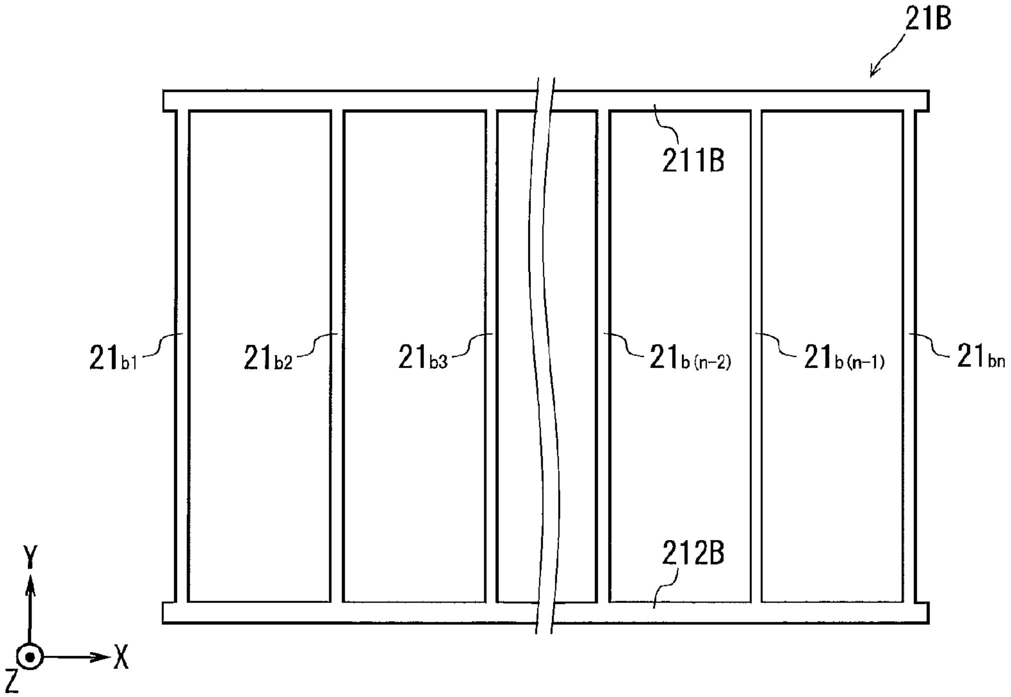
FIG. 15 is a plan view showing an exemplary configuration of a power feeding portion according to the second modification.

The power feeding portion 21B is provided in the form of a layer on the other main surface (here, the surface at the +Z side) of the transparent base plate 11. FIG. 15 is a plan view schematically showing an exemplary configuration of the power feeding portion 21B. As shown in FIG. 15, the power feeding portion 21B includes two main wirings 211B and 212B, and n (n is a natural number equal to or greater than two) sub wirings $21_{b1}$ to $21_{bn}$.

The two main wirings 211B and 212B extend along the X direction, and are spaced apart from each other in the Y direction. The other main surface (here, the surface at the +Z side) of the transparent base plate 11 has first and second outer edges opposed to each other. The main wiring 211B extends near the first outer edge and along the first outer edge. The main wiring 212B extends near the second outer edge and along the second outer edge.

Each of the n sub wirings $21_{b1}$ to $21_{bn}$ extends along the Y direction from the main wiring 211B to the main wiring 212B. The n sub wirings $21_{b1}$ to $21_{bn}$ are sequentially arranged at predetermined intervals therebetween. More specifically, the n sub wirings $21_{b1}$ to $21_{bn}$ are arranged spatially periodically in the X direction. The n sub wirings $21_{b1}$ to $21_{bn}$ are electrically connected to the power supply 2 via the two main wirings 211B and 212B.

This power feeding portion 21B can be made by, for example, forming a film through a vapor-deposition process, a sputtering process, or the like, with use of a metal mask. A material of the power feeding portion 21B may be a transparent material such as ITO, or may be a good conductor such as copper. Here, it is preferable that the material of the power feeding portion 21B has an electrical resistivity lower than that of the material of the lower electrode layer 12B.

As shown in FIG. 14, the lower electrode layer 12B is formed on the other main surface (here, the surface at the +Z side) of the transparent base plate 11, on which the power feeding portion 21B is provided, in a substantially flat shape such that the lower electrode layer 12B covers the n sub wirings $21_{b1}$ to $21_{bn}$. Thus, the n sub wirings $21_{b1}$ to $21_{bn}$ are electrically connected to the lower electrode layer 12B. When a voltage is applied between the power feeding portions 21 and 22, the n sub wirings $21_{b1}$ to $21_{bn}$ apply a voltage between the lower electrode layer 12B and the upper electrode layer 14B.

The electrical resistance of the lower electrode layer 12B in one direction (here, in the +X direction) is set higher than the electrical resistance of the upper electrode layer 14B in one direction (here, in the +X direction). Such setting of the electrical resistance is achieved by, for example, appropriately adjusting at least one of the thickness and the material of each of the upper electrode layer 14B and the lower electrode layer 12B. An adjustment of the thickness of a layer is achieved by, for example, a film formation time period in a vapor-deposition process, a sputtering process, or the like. A change of the material of a layer is achieved by, for example, changing a target material in a sputtering process.

The light emission layer 13B is formed on the lower electrode layer 12B, with a substantially uniform thickness. The upper electrode layer 14B is formed on the light emission layer 13B, with a substantially uniform thickness.

In the illumination device 1B according to the second modification including the above-described configuration, when a voltage is applied between the power feeding portion 21B and the power feeding portion 22, a voltage is applied between the lower electrode layer 12B and the upper electrode layer 14B. At this time, the voltage applied between the lower electrode layer 12B and the upper electrode layer 14B drops at a location farther from each of the sub wiring $\mathbf{21}_{b1}$ to $\mathbf{21}_{bn}$, due to a relatively high electrical resistance of the lower electrode layer 12B.

When the surface light emitter 10B emits light, a spatially periodic luminance variation having a substantially constant amplitude occurs in the light-emitting surface of the surface light emitter 10B in accordance with the voltage drop centered at each sub wiring $\mathbf{21}_{b1}$ to $\mathbf{21}_{bn}$.

Figure 16:
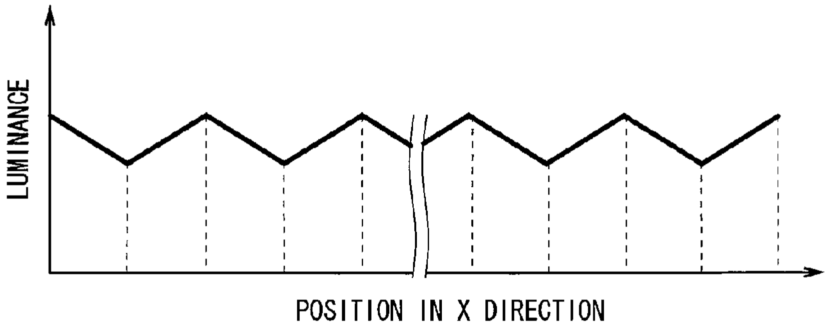
FIG. 16 is a diagram showing a luminance variation occurring in the surface light emitter according to the second modification.

FIG. 16 is a diagram illustrating a luminance variation occurring in the light-emitting surface of the surface light emitter 10B. In FIG. 16, the horizontal axis represents a position in the X direction, and the vertical axis represents the luminance. A luminance variation occurring in the light-emitting surface along with a position change in the X direction is indicated by the thick line. When the n sub wirings $\mathbf{21}_{b1}$ to $\mathbf{21}_{bn}$ are not transparent, the luminance drops because of light shielding caused by the presence of the n sub wirings $\mathbf{21}_{b1}$ to $\mathbf{21}_{bn}$. However, illustration of such a luminance drop is omitted in FIG. 16. Even if such a luminance drop occurs, a spatially periodic luminance variation having a substantially constant amplitude occurs in the light-emitting surface of the surface light emitter 10B.

As described above, also in the illumination device 1B according to the second modification, similarly to the illumination device 1 according to the embodiment described above, uneven light emission that the user may perceive can be suppressed with a relatively simple configuration.

A similar effect is obtained also when, instead of providing the power feeding portion 21B, the power feeding portion 22 having the same shape as that of the power feeding portion 21B is electrically connected to the upper electrode layer 14B and the electrical resistance of the upper electrode layer 14B in one direction (here, in the +X direction) is set higher than the electrical resistance of the lower electrode layer 12B in one direction (here, in the +X direction).

<(5-3) Third Modification>

Figure 17:
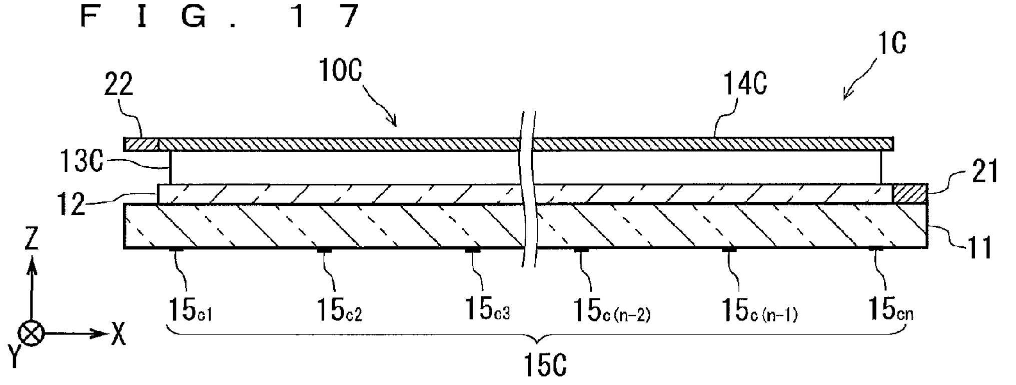
FIG. 17 is a cross-sectional view showing an exemplary configuration of a surface light emitter according to a third modification.

FIG. 17 is a cross-sectional view schematically showing an exemplary configuration of a surface light emitter 10C of an illumination device 1C according to a third modification. The surface light emitter 10C is basically identical to the surface light emitter 10 according to the embodiment described above, except that the light emission layer 13 and the upper electrode layer 14 are replaced with a light emission layer 13C and an upper electrode layer 14C, respectively, and that a pattern portion 15C is additionally provided.

The light emission layer 13C is formed on the lower electrode layer 12, with a substantially uniform thickness. The upper electrode layer 14C is formed on the light emission layer 13C, with a substantially uniform thickness.

Figure 18:
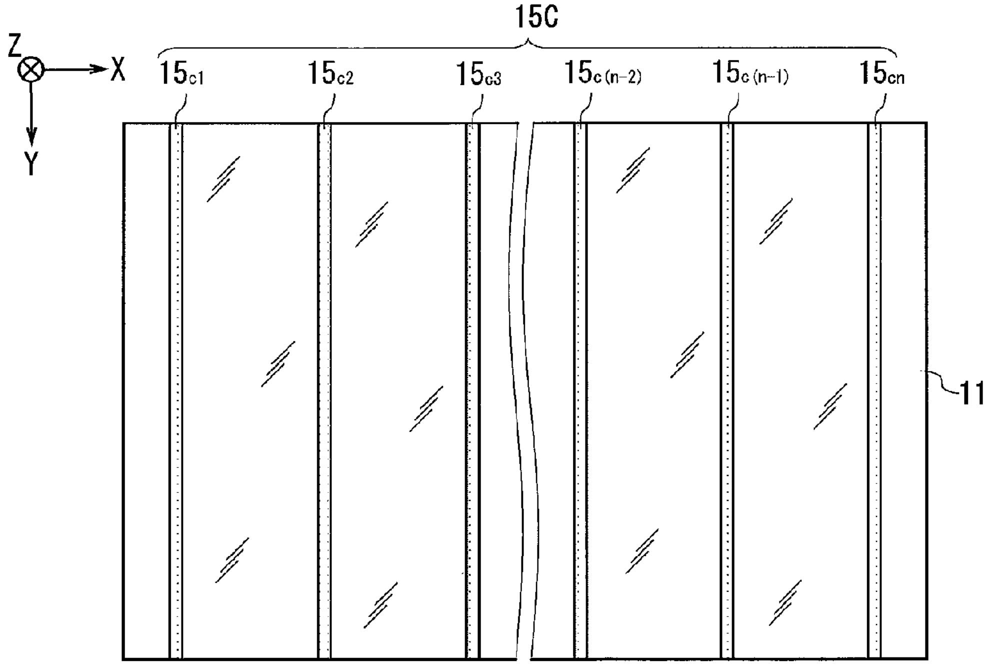
FIG. 18 is a bottom view showing the exemplary configuration of the surface light emitter according to the third modification.

FIG. 18 is a bottom view schematically showing an exemplary configuration of the pattern portion 15C. The pattern portion 15C is structured such that n linear patterns $\mathbf{15}_{c1}$ to $\mathbf{15}_{cn}$ each extending along the Y direction are arranged sequentially in the X direction on one main surface (here, the surface at the −Z side) of the transparent base plate 11. In other words, n linear patterns $\mathbf{15}_{c1}$ to $\mathbf{15}_{cn}$ extending along another direction (Here, in the Y direction) substantially perpendicular to one direction (here, in the X direction) are arranged spatially periodically in the one direction (X direction).

For example, this pattern portion 15C may be a ground glass pattern portion formed by etching one main surface of the transparent base plate 11, or may be a concave or convex portion. The pattern portion 15C may be a transparent film with the n patterns $\mathbf{15}_{c1}$ to $\mathbf{15}_{cn}$ being formed on one main surface of the transparent base plate 11. As the transparent film, the one is conceivable in which, for causing no light loss, the n patterns $\mathbf{15}_{c1}$ to $\mathbf{15}_{cn}$ transmit light in a predetermined direction (for example, in a normal direction of the film) while the other portions transmit light in various directions.

The presence of this pattern portion 15C can cause a spatially periodic luminance variation having a substantially constant amplitude to occur in the light-emitting surface of the surface light emitter 10C, when the surface light emitter 10C emits light. This luminance variation may be, for example, at least one or a combination of continuous increase and decrease in luminance, discrete and linear increase and decrease in luminance, discrete and point-like increase and decrease in luminance.

As described above, also in the illumination device 1C according to the third modification, similarly to the illumination device 1 according to the embodiment described above, uneven light emission that the user may perceive can be suppressed with a relatively simple configuration.

<(5-4) Fourth Modification>

Figure 19:
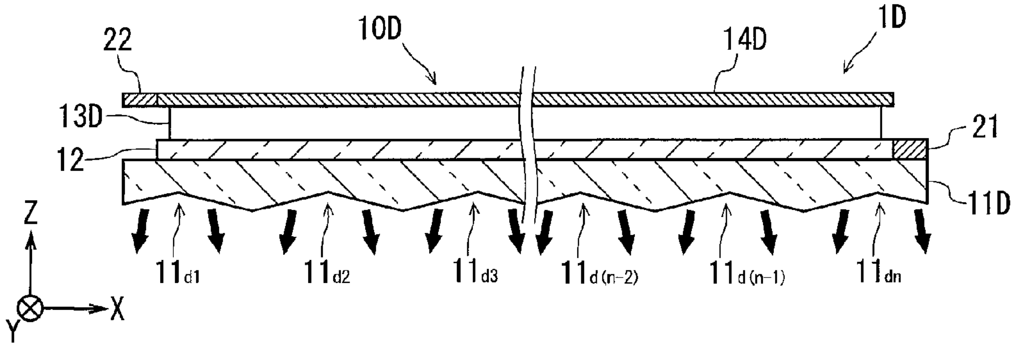
FIG. 19 is a cross-sectional view showing an exemplary configuration of a surface light emitter according to a fourth modification.

FIG. 19 is a cross-sectional view schematically showing an exemplary configuration of a surface light emitter 10D of an illumination device 1D according to a fourth modification. The surface light emitter 10D is basically identical to the surface light emitter 10 according to the embodiment described above, except that the transparent base plate 11, the light emission layer 13, and the upper electrode layer 14 are replaced with a transparent base plate 11D, a light emission layer 13D, and an upper electrode layer 14D, respectively.

The light emission layer 13D is formed on the lower electrode layer 12, with a substantially uniform thickness. The upper electrode layer 14D is formed on the light emission layer 13D, with a substantially uniform thickness.

The transparent base plate 11D has roughly a flat plate shape, and includes one main surface (the surface at the −Z side) and the other main surface (the surface at the +Z side). In the one main surface, spatially periodic concavities and convexities having a substantially constant amplitude are provided. The other main surface is substantially flat. Herein, the transparent base plate 11D is structured such that n linear concavities $\mathbf{11}_{d1}$ to $\mathbf{11}_{dn}$ extending along the Y direction are arranged sequentially in the X direction on the one main surface of the transparent base plate 11. In other words, the n linear concavities $\mathbf{11}_{d1}$ to $\mathbf{11}_{dn}$ extending along another direction (here, in the Y direction) substantially perpendicular to one direction (here, in the X direction) are arranged spatially periodically in the one direction (X direction).

Due to the concavities and convexities provided in the transparent base plate 11D, as indicated by the black arrows in FIG. 19, when light generated by the light emission layer 13D transmits through the transparent base plate 11D, concentration and diffusion of the light occurs because of refraction in the one main surface (the surface at the −Z side) of the transparent base plate 11D. As a result, when the surface light emitter 10D emits light, a spatially periodic luminance variation having a substantially constant amplitude occurs in the light-emitting surface of the surface light emitter 10D.

As described above, also in the illumination device 1D according to the fourth modification, similarly to the illumination device 1 according to the embodiment described above, uneven light emission that the user may perceive can be suppressed with a relatively simple configuration.

<(5-5) Other Modifications>

In the embodiment described above and the first to fourth modifications described above, when the surface light emitter 10, 10A to 10D emits light, one spatially periodic luminance variation having a substantially constant amplitude occurs in the light-emitting surface of the surface light emitter 10, 10A to 10D. However, this is not limiting.

For example, from the viewpoint of further suppression of uneven light emission, it is more preferable to generate a luminance variation with another luminance variation having a different spatial frequency being superimposed thereon. In other words, it is more preferable to generate a luminance variation in which a spatially periodic luminance variation having a substantially constant amplitude and a first spatial frequency and a spatially periodic luminance variation having a substantially constant amplitude and a second spatial frequency different from the first spatial frequency are superimposed on each other. Three or more kinds of luminance variations may be superimposed.

However, from the viewpoint of avoiding occurrence of uneven light emission by interference between different spatial frequencies, it is preferable that the relationship between the different spatial frequencies of the luminance variations superimposed on each other is an integer multiple. Such spatially periodic luminance variations are achieved by, for example, applying, to a luminance variation, at least one of a triangular wave and a square wave containing a plurality of wave components whose spatial frequencies have the relationship of an integer multiple.

Intentionally generating a luminance variation in which luminance variations having different spatial frequencies are superimposed on each other is achieved by, for example, appropriately adjusting the configurations according to the embodiment described above and the first to fourth modifications described above. To be specific, it is achieved by at least one or a combination of: an adjustment of the thickness of the light emission layer 13 according to the embodiment described above; an adjustment of the arraying of the plurality of light emission units $\mathbf{1}A_1$ to $\mathbf{1}A_n$ according to the first modification described above; an adjustment of the arraying of the plurality of sub wirings $\mathbf{21}_{b1}$ to $\mathbf{21}_{bn}$ according to the second modification described above; an adjustment of the pattern according to the third modification described above; and an adjustment of the concavities and convexities of the transparent base plate 11D according to the fourth modification described above.

In the embodiment described above and the first to fourth modifications described above, when the surface light emitter 10, 10A to 10D emits light, a spatially periodic luminance variation having a substantially constant amplitude occurs in one direction, in the light-emitting surface of the surface light emitter 10, 10A to 10D. However, this is not limiting.

For example, from the viewpoint of further suppression of uneven light emission, it is more preferable to generate a luminance variation in which spatially periodic luminance variations having substantially constant amplitudes and occurring in two or more directions are superimposed on each other. In other words, it is more preferable to generate a luminance variation in which a spatially periodic luminance variation having a substantially constant amplitude and occurring in a first direction and a spatially periodic luminance variation having a substantially constant amplitude and occurring in a second direction different from the first direction are superimposed on each other.

Here, the angle formed between the first direction and the second direction may be any angle more than 0° and not more than 90°. In order that uneven light emission that the user may perceive due to uneven luminance in a certain direction can be more efficiently suppressed, it is preferable to generate a spatially periodic luminance variation having a substantially constant amplitude and occurring in a direction that is identical to the certain direction. Therefore, when the first direction and the second direction are substantially perpendicular, the uneven light emission is more efficiently suppressed irrespective of the direction in which the uneven luminance occurs. Three or more kinds of luminance variations may be superimposed.

Intentionally generating a luminance variation in which luminance variations in two or more different directions are superimposed on each other is achieved by, for example, appropriately adjusting the configurations according to the embodiment described above and the first to fourth modifications described above. To be specific, it is achieved by at least one or a combination of: an adjustment of the thickness of the light emission layer 13 according to the embodiment described above; an adjustment of the arraying of the plurality of light emission units $\mathbf{1}A_1$ to $\mathbf{1}A_n$ according to the first modification described above; an adjustment of the arraying of the plurality of sub wirings $\mathbf{21}_{b1}$ to $\mathbf{21}_{b}$ according to the second modification described above; an adjustment of the pattern according to the third modification described above; and an adjustment of the concavities and convexities of the transparent base plate 11D according to the fourth modification described above.

From the viewpoint of further suppression of uneven light emission, it may be possible to adopt a configuration in which a random luminance variation is intentionally generated.

In the embodiment described above and the first to fourth modifications described above, the surface light emitter 10, 10A to 10D has a substantially planar shape. However, this is not limiting, and the surface light emitter 10, 10A to 10D may have various surface shape such as a curved surface shape.

In the embodiment described above and the first to fourth modifications described above, increase and decrease in luminance is adopted for intentionally generating the luminance variation. However, this is not limiting. For example, a luminance variation may be intentionally generated by providing a light shield having a spatially periodic array for shielding light on a light path extending from the generation of light in the light emission layer 13, 13A to 13D to the exit of the light in the transparent base plate 11, 11D. The light shield having a spatially periodic array is achieved by, for example, a method in which an insulator, or the like, that does not allow a visible light beam to transmit therethrough is formed at an arbitrary position in a region extending from the light emission layer 13, 13A to 13D to the one main surface of the transparent base plate 11, 11D through a vapor-deposition process, a sputtering, or the like, with use of a metal mask.

The whole or part of the configurations of the embodiment and various modifications described above can be appropriately combined so long as they are not mutually contradictory.

Furthermore, the technical idea of the present invention is applicable generally to an illumination device that performs surface light emission.

DESCRIPTION OF THE REFERENCE NUMERALS

| | |
|---|---|
| 1, 1A to 1D | illumination device |
| $1A_1$ to $1A_N$ | light emission unit |
| 10, 10A to 10D | surface light emitter |
| 11, 11D | transparent base plate |
| $11_{d1}$ to $11_{dn}$ | concavity |
| 12, 12A, 12B | lower electrode layer |
| $12_{a1}$ to $12_{an}$, $12_{aM}$, $12_{aN}$ | divided lower electrode layer |
| 13, 13A to 13D | light emission layer |
| $13_{a1}$ to $13_{an}$, $13_{aN}$ | divided light emission layer |
| 14, 14A to 14D | upper electrode layer |
| $14_{a1}$ to $14_{an}$, $14_{aM}$, $14_{aN}$ | divided upper electrode layer |
| $21_{b1}$ to $21_{bn}$ | sub wiring |
| 21, 21B, 22 | power feeding portion |
| 211B, 212B | main wiring |

The invention claimed is:

1. An illumination device comprising:

a power feeding portion; and a surface light emitter comprising:

a transparent base plate, where a shape of a first side of said transparent base plate is substantially flat;

a first electrode provided at said first side of said transparent base plate, and having a light transparency;

a second electrode provided at a side of said first electrode opposite said transparent base plate; and a light-emission layer provided between said first electrode and said second electrode and having an area along said transparent base plate, said light-emission layer being configured to generate light in accordance with a voltage applied by said power feeding portion, wherein said light-emission layer is divided into a plurality of divided light-emission layers arranged along said transparent base plate and each of said plurality of divided light-emission layers generates light non-uniformly, and wherein, when said light-emission layer generates light, said surface light emitter emits light having a spatially periodic luminance variation with a substantially constant amplitude according to said non-uniformity of said light generated in each of said plurality of divided light-emission layers.

2. The illumination device according to claim 1, wherein said surface light emitter is configured to emit light having a spatially periodic luminance variation so that an increase and decrease in luminance is repeated five times or more and twenty times or less per viewing angle of 1°.

3. The illumination device according to claim 1, wherein said luminance variation is generated by superimposition of a spatially periodic luminance variation having a substantially constant amplitude and occurring in a first direction and a spatially periodic luminance variation having a substantially constant amplitude and occurring in a second direction different from said first direction.

4. The illumination device according to claim 1, wherein said luminance variation generated by said surface light emitter is generated by superimposition of a spatially periodic luminance variation having a substantially constant amplitude and a first spatial frequency and a spatially periodic luminance variation having a substantially constant amplitude and a second spatial frequency different from said first spatial frequency.

5. The illumination device according to claim 4, wherein said luminance variation generated by said surface light emitter includes a spatially periodic luminance variation in accordance with at least one of a triangular wave and a square wave having a substantially constant amplitude.

6. The illumination device according to claim 1, wherein said surface light emitter is structured such that a plurality of light emission units are arranged in parallel at least in one direction, in each pair of said plurality of light emission units neighboring each other in said at least one direction among said plurality of light emission units, a first end portion of said first electrode included in a first light emission unit in said pair of said plurality of light emission units is electrically connected to a second end portion of said second electrode included in a second light emission unit in said pair of said plurality of light emission units, in accordance with voltage application to said surface light emitter by said power feeding portion, a voltage is applied between said first end portion of said first electrode and said second end portion of said second electrode in each of said plurality of light emission units, in each of said plurality of light emission units, an electrical resistance of said first electrode in said at least one direction is higher than an electrical resistance of said second electrode in said at least one direction.

* * * * *